US008344797B2

(12) United States Patent
Crespi et al.

(10) Patent No.: US 8,344,797 B2
(45) Date of Patent: Jan. 1, 2013

(54) SYSTEMS AND METHODS FOR OFFSET CANCELLATION METHOD FOR DC-COUPLED AUDIO DRIVERS

(75) Inventors: Lorenzo Crespi, Costa Mesa, CA (US); Christian Larsen, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 467 days.

(21) Appl. No.: 12/623,202

(22) Filed: Nov. 20, 2009

(65) Prior Publication Data

US 2011/0123049 A1   May 26, 2011

(51) Int. Cl.
*H03F 1/02*   (2006.01)
(52) U.S. Cl. ............................................ 330/9; 381/121
(58) Field of Classification Search ...... 330/9, 252–261, 330/124 R, 295, 310
See application file for complete search history.

(56) References Cited

U.S. PATENT DOCUMENTS

| | | | |
|---|---|---|---|
| 3,699,444 A | 10/1972 | Ghose et al. | |
| 4,423,385 A | 12/1983 | Evans | |
| 4,996,529 A | 2/1991 | Connell | |
| 5,140,699 A | 8/1992 | Kozak | |
| 5,272,481 A | 12/1993 | Sauer | |
| 6,011,435 A | 1/2000 | Takeyabu et al. | |
| 6,498,530 B1 | 12/2002 | Tang | |
| 6,529,152 B1 | 3/2003 | Piasecki et al. | |
| 6,750,703 B1 | 6/2004 | Shen et al. | |
| 7,312,654 B2 | 12/2007 | Roeckner | |
| 7,336,123 B2 * | 2/2008 | Yoshida et al. | 330/9 |
| 7,348,824 B2 | 3/2008 | Naviasky et al. | |
| 7,405,614 B2 | 7/2008 | Gutzki et al. | |
| 7,443,233 B2 | 10/2008 | Jang | |
| 7,538,605 B2 | 5/2009 | Yen | |
| 7,605,646 B2 | 10/2009 | Trifonov et al. | |
| 2006/0182266 A1 | 8/2006 | Cusinato | |
| 2008/0143852 A1 | 6/2008 | Desprez-le-Goarant et al. | |

OTHER PUBLICATIONS

Chong-Gun Yu, Randall L. Geiger, "Precision Offset Compensated Op-Amp with Ping-Pong Control", Iowa State University, p. 189-190, 6.32, Electrical Engineering and Computer Engineering Department, Ames, Iowa, USA.
Daniel Dzahini, Hamid Ghazlane, "Auto-Zero Stabilized CMOS Amplifiers for Very Low Voltage or Current Offset", Laboratoire de Physique Subatomique et de Cosmologie, Centre National de IAEnergie, des Sciences et des Techniques Nucleaires, 5 pages, France and Morocco.
Christian C. Enz, Gabor C. Temes, "Circuit Techniques for Reducing the Effects of Op-Amp Imperfections: Autozeroing, Correlated Double Sampling, and Chopper Stabilization", Proceedings of the IEEE, Nov. 1996, pp. 1584-1614, vol. 84, No. 11, IEEE.
Thomas Kugelstadt, "Auto-Zero Amplifiers Ease the Design of High-Precision Circuits", Analog Applications Journal, 2Q 2005, pp. 19-27, Texas Instruments Incorporated, USA.
Ivars G. Finvers, J.W. Haslett, F.N. Trofimenkoff, "A High Temperature Precision Amplifier", IEEE Journal of Solid-State Circuits, Feb. 1995, pp. 120-128, vol. 30, No. 2, IEEE.

(Continued)

*Primary Examiner* — Hieu Nguyen
(74) *Attorney, Agent, or Firm* — Farjami & Farjami LLP

(57) ABSTRACT

Direct current (DC) offset in and audio driver can cause a constant drain on power even when there is no sound. Furthermore it can cause an audible pop when the audio driver is enabled. A scaled replica output stage can be employed to perform DC offset cancellation offline during a sampling phase. Once DC offset cancellation is achieved, the audio driver uses a full scale output stage during the operation phase.

25 Claims, 12 Drawing Sheets

OTHER PUBLICATIONS

F.N. Trofimenkoff, I.G. Finvers, J.W. Haslett, "DC Measurement Errors Due to Auto-Zeroed Amplifier Noise", IEEE Transactions of Instrumentation and Measurement, Feb. 1996, pp. 317-318, vol. 45, No. 1, IEEE.

Ivars G. Finvers, James W. Haslett, F.N. Trofimenkoff, "Noise Analysis of a Continuous-Time Auto-Zeroed Amplifier", IEEE Transactions on Circuits and Systems-II: Analog and Digital Signal Processing, Dec. 1996, pp. 791-800, vol. 43, No. 12, IEEE.

\* cited by examiner

SYSTEMS AND METHODS FOR OFFSET CANCELLATION METHOD FOR DC-COUPLED AUDIO DRIVERS

BACKGROUND OF THE INVENTION

1. Field of the Invention

The present invention relates generally to audio drivers and specifically with DC offset cancellation.

2. Related Art

FIG. 1 shows a conventional digital audio driver. Driver 100 comprises a digital to analog converter (DAC) 102, amplifier stage 104 and an output stage.106. DAC 102 converts a digital audio signal into an analog audio signal. Amplifier stage 104 amplifies the analog audio signal. The primary purpose of output stage 106 is to maintain the output regardless of the current drawn through it, but in some implementations the output stage may supply some amount of gain.

In most analog circuits, such as the audio driver, a DC offset is present. FIG. 2A schematically shows the DC offset as fixed voltage 202 in series with an ideal audio driver component 204, which provides audio output 206, referenced as $V_{OUT}$. This output is used to drive load 208 represented here by headphones.

As shown in FIG. 2B, issues with a DC offset in an audio driver are often resolved where the load 208 is AC-coupled, such as with external capacitor 210 which is inserted between the output of the audio driver and load 208. However, modern integrated audio drivers consolidate components onto a single integrated circuit eliminating costlier components such as a large capacitor. Larger capacitors provide better isolation while minimizing the affect on the frequency response of the audio driver. If a smaller capacitor were used, there would be more attenuation in the low frequencies resulting in perceived diminished "bass" by a listener.

Integrated audio drivers that are directly coupled to the load introduce problems due to the presence of DC offset at the driver output. The DC offset will cause current to flow into the load even when no sound is present increasing the average power consumption. This is particularly a problem when driving low-impedance headphones. Another problem is that when the driver is enabled, the output voltage will abruptly change, causing an audible "pop" sound.

FIG. 3 illustrates the pop problem in direct coupled audio drivers. Graph 302 is representative of the enable signal received by the audio driver. Graph 304 is representative of the output voltage of the audio driver around the time the audio driver is enabled. At time 306, the output voltage jumps from 0V to $V_{OS}$, resulting in an audible pop even for offset voltages as low as 1 mV.

Traditional techniques for removing DC offsets from amplifiers fall into two categories, auto-zeroing and chopper stabilization. FIG. 4 illustrates an analog method of auto-zeroing applied to an amplifier. When using auto-zeroing the amplifier has a sampling phase where the DC offset is removed and an operation phase where the amplifier amplifies an input signal. In the example shown in FIG. 4, switch 410 is connected to ground, or in the case of a differential amplifier, the positive and negative inputs of the differential amplifier are connected to each other (i.e., a zero input in either case). Offset voltage 402 and amplifier 404 produce an output which should be representative of the DC offset because the input is effectively zero due to switch 410. The output is sampled by sample/hold 408. Optionally, buffer 406 is used to supply the voltage to sample/hold 408. Buffer 406 may be an amplifier with or without gain. The purpose is to sample the voltage at the output without supplying a significant load which could affect the output voltage. Sample/hold 408 feeds back the voltage to amplifier 404, which is adjusted to zero out the offset. After the sampling phase is completed, the adjustment to the amplifier is fixed and switch 410 connects the amplifier back to the input and the amplifier functions now in the operational stage.

FIG. 5 illustrates a digital implementation of auto-zeroing applied to an amplifier. Switch 512 operates similarly to switch 410 in FIG. 4, controlling the input to the amplifier when in the sampling phase and the operational phase. The remaining components are similar to their counter parts in FIG. 4. The key difference is successive approximation register (SAR) 508 is used to determine the voltage after a number of clock cycles. The digital representation of the voltage is fed to DAC 510 which supplies the voltage to the amplifier so that the voltage can be adjusted to a zero offset. Once the offset voltage is determined, the SAR output can be fixed and the amplifier transitions to the operational stage and functions with zero offset.

The chopper stabilization approach applies a modulation to the input signal and a corresponding demodulation to the output signal. Since the DC offset only encounters the demodulation, it is effectively modulated to a higher frequency. More specifically, FIG. 6 illustrates a basic chopper stabilized amplifier. Again the amplifier is shown as ideal amplifier 604 with fixed voltage offset 602. The input signal is modulated with mixer 606 where carrier signal 612 is the desired frequency that the DC offset is displaced to. The output signal is demodulated with mixer 610 with carrier signal 614. Typically the carrier signals are square waves at a given frequency. Because the input is modulated and then demodulated, its frequency profile does not change. However, the DC offset is effectively modulated by mixer 610 to the frequency of 614. In this fashion, the DC offset is removed from the amplifier.

A drawback of the auto zeroing approach is that in an audio driver the load may be connected to the driver before it is enabled. When the amplifier is first enabled, the offset would be present because the auto-zeroing has not been applied to remove the DC offset, and a pop would still be heard. One attempt to remedy this is to use two amplifiers and "ping-pong" between them. That is while one amplifier is in the sampling phase, the other amplifier is in the operational phase and only the one in the operational phase is connected to the output. This can prove costly to implement because it doubles the hardware used in the amplifier stage and, furthermore, it may not solve the problem because neither amplifier can be auto-zeroed until they are enabled, so there may still be an initial pop.

A chopper stabilized amplifier would have no DC offsets from the time it is enabled because there is no sampling phase like the auto-zeroing technique. The drawback of the chopper stabilization is that it is a more complicated solution. Generally the chopper stabilization is used only to remove the offset from an amplifier leaving potential DC offsets from other components in the audio driver. Even though the DC offset is modulated, it still is present except as a higher frequency signal. Unless this signal is filtered out, it can still cause current to flow to the load.

FIG. 7 illustrates another approach to isolating an amplifier until the DC offset can be removed by auto-zeroing. For the sake of example, the auto-zeroing technique of FIG. 5 is used. During the sampling phase, switch 702 disconnects the audio driver from load 704. After the sampling phase is completed switch 702 is closed and connects the audio driver to load 704. The switch 702 is required to switch a signal after it has been amplified and can carry substantial power. Some drawbacks of using such a switch are that the switch can be very expensive or/and degrade the driver performance.

There is a need in the industry to eliminate DC offset from an audio driver which is not expensive and does not degrade the driver performance.

SUMMARY OF INVENTION

An audio driver equipped with DC offset cancellation comprising an input stage that receives and amplifies an audio sound signal, an output stage for driving a load, a replica output stage coupled to the input stage, that connects the output stage to the input stage and an auto-zeroing circuit coupled to the output of the replica stage which adjusts the input stage to cancel any DC offset detected at the output of the replica output stage. The output stage can comprise an NFET and a PFET. The audio driver can further comprise a switch which connects the gate of the NFET to the high supply voltage and another switch which connects the gate of the PFET to the low supply voltage to put the output stage into a high-impedance mode during the sampling. Typically the replica output stage is substantially smaller than the output stage.

The auto-zeroing circuit comprises a comparator and successive approximation logic, which is frozen after the sampling phase is completed. The auto-zeroing circuit can comprise a low-pass filter.

This auto-zeroing configuration can be applied to output stages that are single ended or differential. It can also be applied in a class AB amplifier where the output stage is in a push-pull configuration and receives two inputs.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Figure 1:
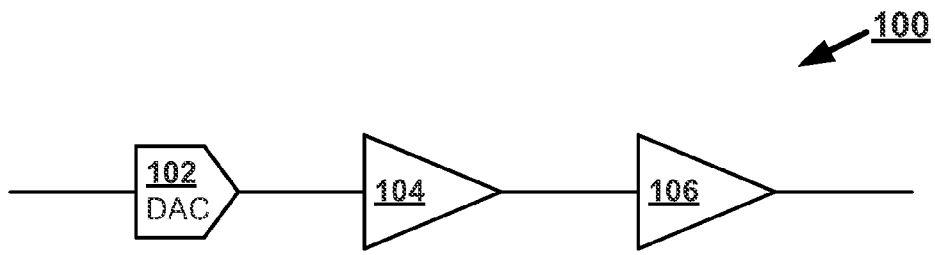
FIG. 1 shows a conventional digital audio driver
Figure 2A:
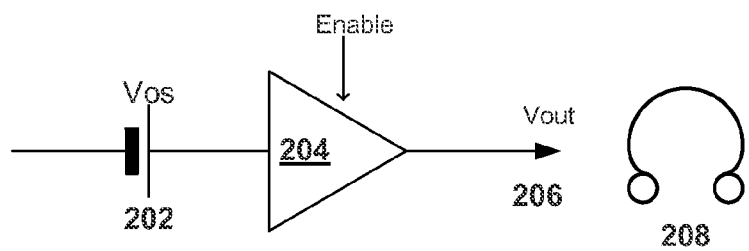
FIG. 2A schematically shows the DC offset as a fixed voltage in series with an ideal audio driver component, which provides audio output.
Figure 2B:
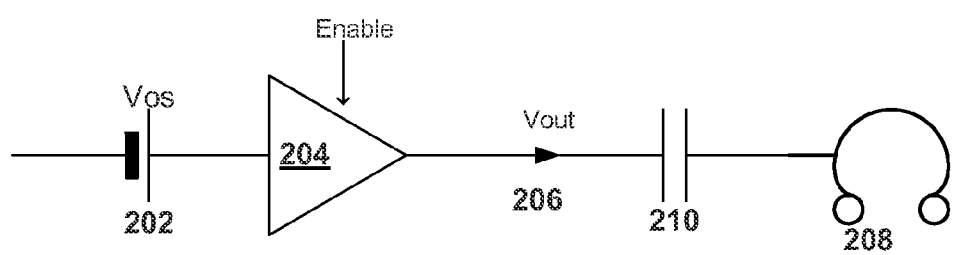
FIG. 2B shows the DC offset in an audio driver as resolved by AC coupling the load with an external capacitor inserted between the output of the audio driver and the load.
Figure 3:
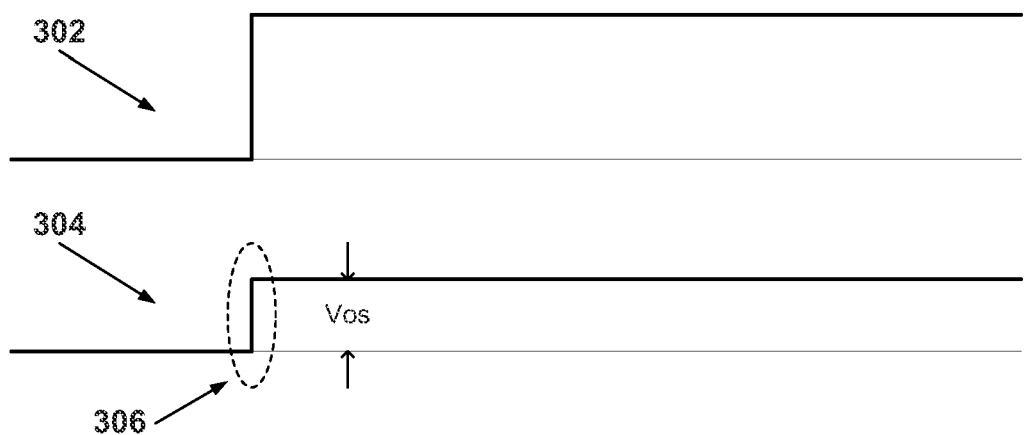
FIG. 3 illustrates the pop problem in direct coupled audio drivers.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

Figure 8:
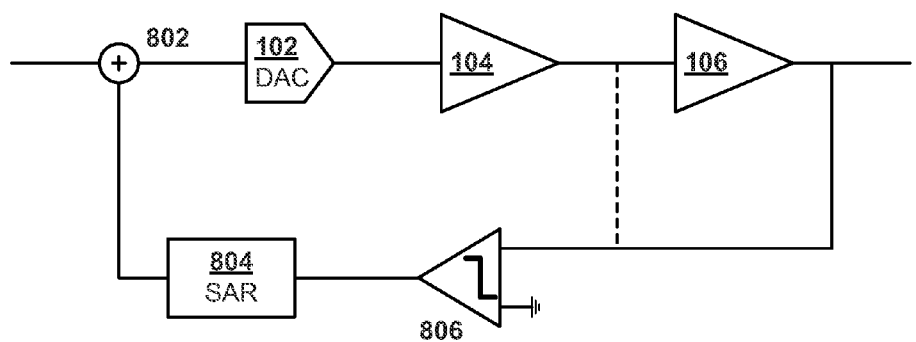
FIG. 8 shows an embodiment of an auto-zeroing audio driver in accordance with the present invention.

FIG. 8 shows an embodiment of an auto-zeroing audio driver in accordance with the present invention. The auto-zeroing audio driver comprises DAC 102, amplifier stage 104 and output stage 106. In addition, an auto-zeroing circuit comprises comparator 806, optional low-pass filter (not shown) and SAR logic 804. Additionally, it can comprise adder 802.

During the sampling phase, the input to the DAC 102 is fixed at zero. In one embodiment, unlike the auto-zeroing of an amplifier, the input can be under software control so that a physical switch is not needed. Comparator 806 receives a signal at the output of the audio driver, but optionally could receive the signal at the output of amplifier stage 104 if the auto-zeroing including the output stage is not desired. Comparator 806 compares the output voltage to ground. Optionally, the output can be low-pass filtered to isolate the DC offset if transient sources of voltage are present such as noise. Based on the sign of comparator 806, SAR logic 804 increments or decrements its internal register and adds the result to the input of DAC 102. Specifically, if comparator 806 determines that the current output voltage is greater than ground, SAR logic 804 decrements its internal register and if comparator 806 determines that the current output voltage is less than ground, SAR logic 804 increments its internal register.

The result in the SAR logic's register is added to DAC 102 by the use of adder 802. In one embodiment, adder 802 is not included and the result of SAR logic 806 can be fed back to controlling software or firmware which adds it to the value sent to the DAC.

When the result from SAR logic 804 is added to the input of DAC 102, the output may change. Upon each iteration, the amount SAR logic 804 increments or decrements its register decreases. Eventually, the register in SAR logic 804 will converge to a value that causes the DC offset to be arbitrarily small. In one embodiment, SAR logic 804 begins with the largest increment first and uses an increment that is half as big as the previous iteration until the increment size reaches the minimum resolution of the register.

When convergence is reached, the output from SAR logic 804 is frozen, such that the value added to the input to DAC 102 is fixed and the audio driver can operate without a DC offset. This configuration has advantages over prior solutions because the DC offset contribution of certain components in the analog portion of an audio driver is removed.

Figure 9:
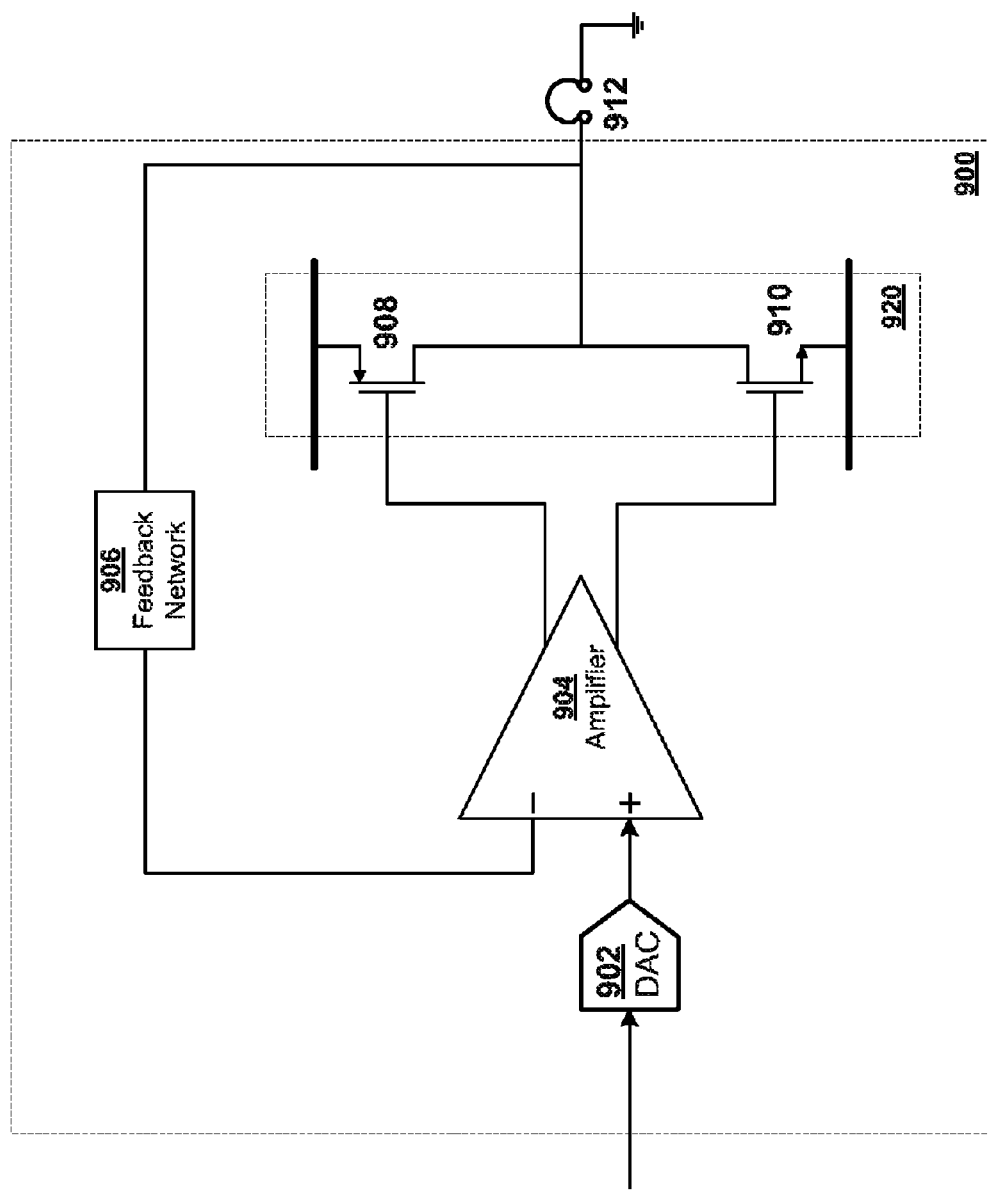
FIG. 9 shows the amplifier and output stages of an audio driver.

Embodiments addressing the problem of the audible pop which occurs at the start of the sampling phase will now be described. Referring to FIG. 9, the amplifier and output stages of an audio driver are shown. Audio driver 900 comprises DAC 902, amplifier 904 and output stage 920. It comprises feedback network 906 in a negative feedback configuration which is used to provide stability to amplifier structure. In this configuration, amplifier 904 provides a dual input to output stage 920. Depending on the application, amplifier 904 drives output stage 920 which is shown in a push-pull configuration where the two inputs to the output stage differ only by a bias voltage as is often the case in a class AB amplifier structure. The audio driver can drive load 912 depicted here as a headphone.

The output stage comprises p-channel field effect transistor (PFET) 908 and n-channel field effect transistor (NFET) 910, where the output is tapped between the drain of PFET 908 and the drain of the NFET 910. The source of PFET 908 is coupled to the high supply voltage rail and the source of NFET 910 is coupled to the low supply rail. In a typical application, the low supply voltage rail may actually be a negative voltage relative to ground and often equal in magnitude to the high supply voltage. In other applications it may be tied to the ground potential.

Figure 4:
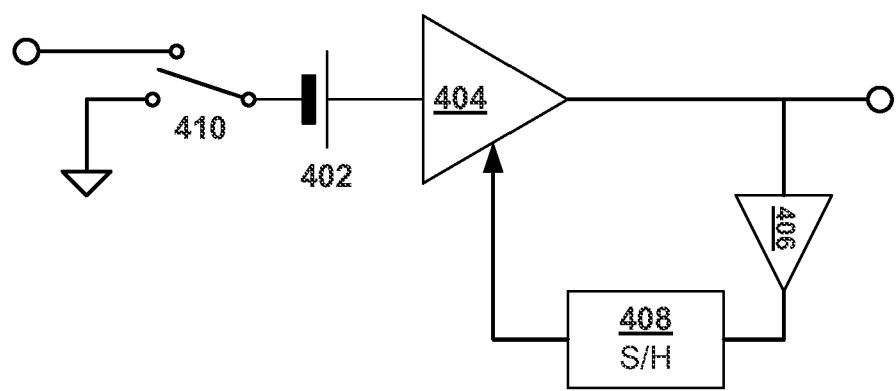
FIG. 4 illustrates an analog method of auto-zeroing applied to an amplifier.
Figure 5:
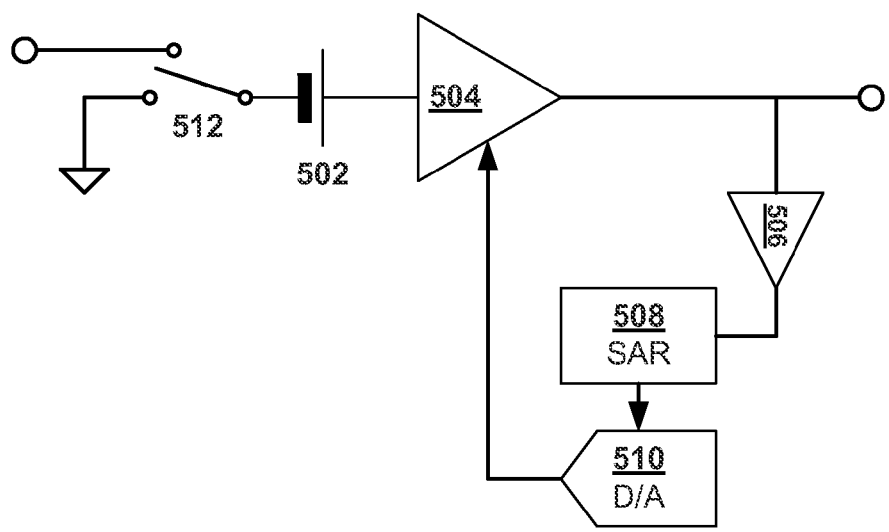
FIG. 5 illustrates a digital implementation of auto-zeroing applied to an amplifier.
Figure 6:
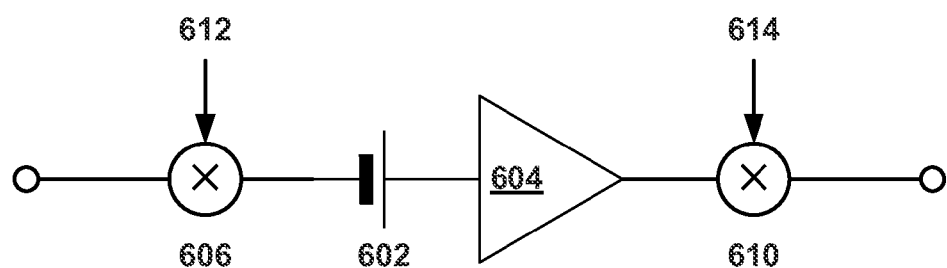
FIG. 6 illustrates a basic chopper stabilized amplifier.
Figure 7:
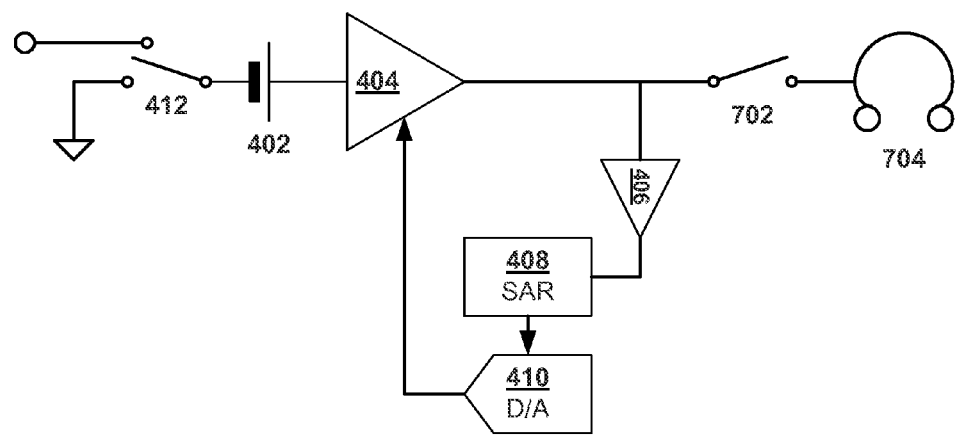
FIG. 7 illustrates another approach to isolating an amplifier until the DC offset can be removed by auto-zeroing.
Figure 10:
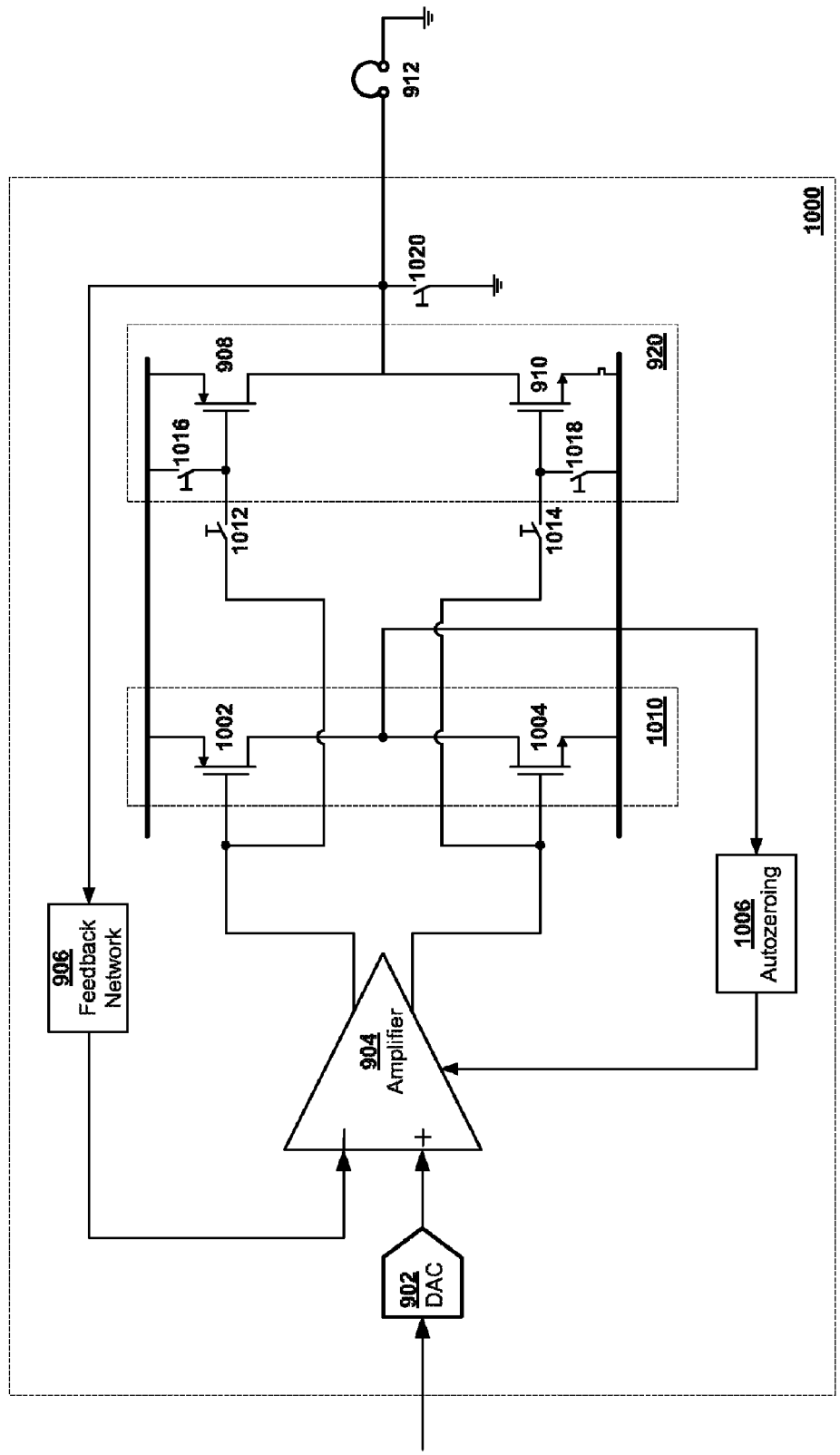
FIG. 10 illustrates an audio driver where the pop from an initial DC offset is removed.

FIG. 10 illustrates an audio driver where the pop from an initial DC offset is removed. Audio driver 1000 comprises DAC 902, amplifier 904, output stage 920, and feedback network 906. The audio driver 1000 further comprises duplicate output stage 1010 which comprises PFET 1002 and NFET 1004. Auto-zeroing circuit 1006 is connected to the output of duplicate output stage 1010. In one embodiment, auto-zeroing circuit 1006 uses one of the circuit techniques shown in FIG. 4, 5 or 8.

During sampling, output stage 920 is disconnected from amplifier 904, the output of output stage 920 is grounded and the output stage should exhibit high impedance so that it doesn't draw significant power during the sampling phase. Switches 1012 and 1014 are opened during the sampling phase and closed during the operational phase. During the sampling phase, switches 1012 and 1014 disconnect output stage 920 from amplifier 904 and connect output stage 920 to amplifier 904 during the operational phase. Switches 1016 and 1018 are closed during the sampling phase and opened during the operational phase. During the sampling phase, switch 1016 connects the gate of PFET 908 to the high supply voltage rail placing PFET 908 into a high impedance state and switch 1018 connects the gate of 910 to the low supply voltage rail placing NFET 910 into a high impedance state to insure little current flows through PFET 908 and NFET 910. Switch 1020 is closed during the sampling phase and opened during the operational phase. During the sampling phase this insures that the output is grounded. After the DC offset is corrected during the sampling phase, the output from the output stage 920 will initially be zero, so when output stage 920 is connected to amplifier 904, there is no voltage change during the transition and hence no pop is heard.

In one embodiment, output stage 1010 is a "scale model" of output stage 920, using smaller field effect transistor (FETs) with the same electrical characteristics. Smaller FETs do not occupy as much space on an integrated circuit and hence are less costly than a full scale output stage. Because the FETs are smaller they cannot handle the same level as current as output state 920, but that is not necessary since duplicate output stage 1010 drive the comparator, not the load. Any difference between the DC offset seen at the output of output stage 920 and duplicate output stage 1010 in this embodiment is negligible in light of the high comparative gain of amplifier 904.

During the sampling phase, output stage 920 is disconnected from the amplifier stage, set to high impedance so the output stage and load do not draw a significant current and grounded at the output. Meanwhile, the auto-zeroing circuit is adjusting amplifier 904 to cancel any DC offset seen at the output of duplicate output stage 1010. The response of the audio driver should be substantially the same as when output stage 920 is connected, so there should be no significant difference in DC offset seen at the output of output stage 920 and duplicate output stage 1010. After the DC offset is zeroed out, the audio driver can be placed in the operational phase. During this transition, the output stage 920 is connected to amplifier 904 by closing switches 1002 and 1004, disconnected from its high impedance state by opening switches 1016 and 1018 and disconnected from ground via switch 1020. Optionally, the duplicate output stage 1010 can be disconnected. However, because duplicate output stage is identical and scaled down, leaving duplicate output stage connected does no harm.

Figure 11:
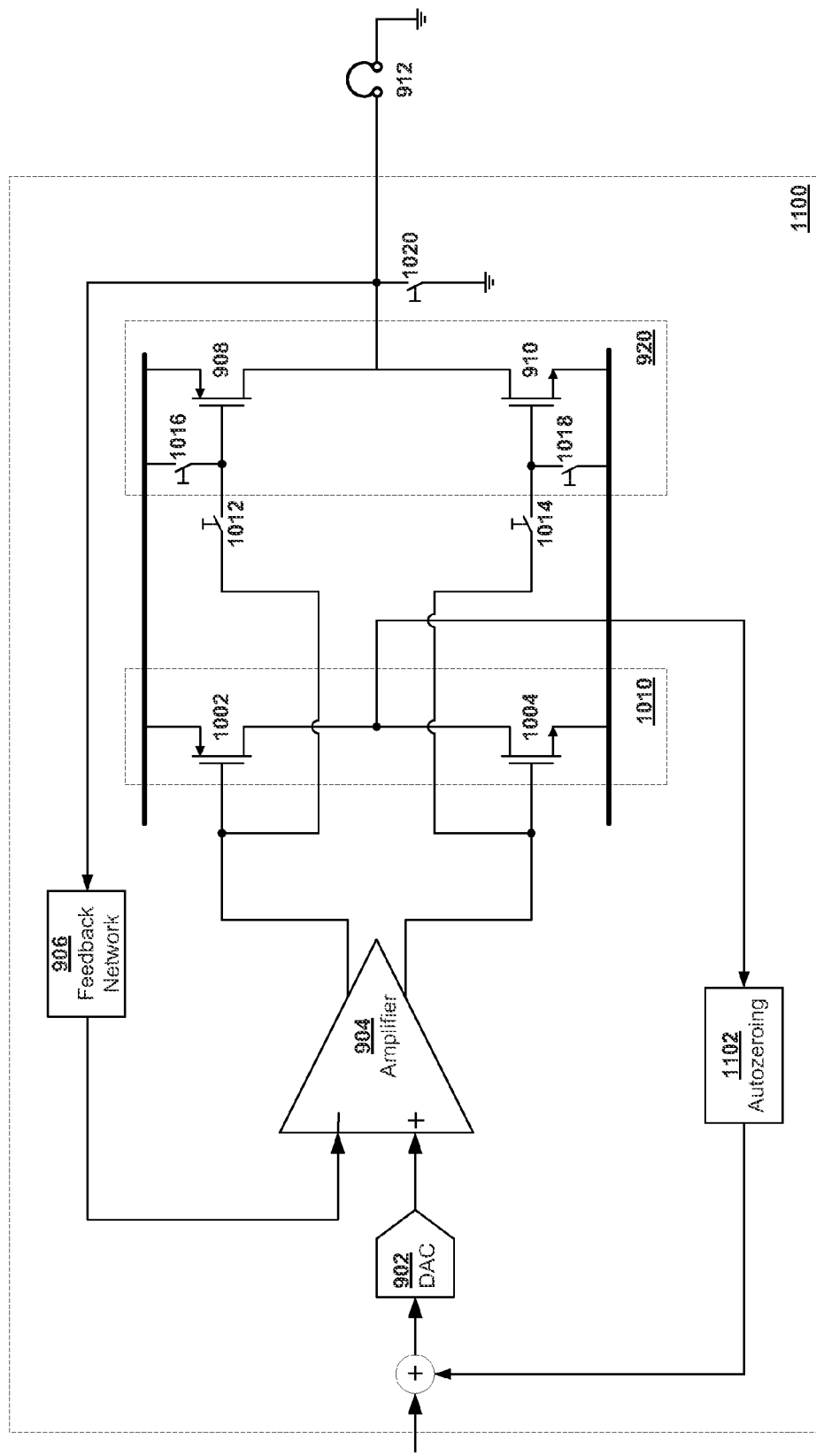
FIG. 11 illustrates an alternate embodiment of an audio driver where the audible pop resulting from an initial DC offset is removed.

FIG. 11 illustrates an alternate embodiment of an audio driver where the audible pop resulting from an initial DC offset is removed. In this embodiment audio driver 1100 differs from audio driver 1000 in that the DC offset seen at duplicate output stage 1010 through auto-zeroing circuit 1102 is fed back and added to the input of DAC 902. All other components function essentially the same way as described for audio driver 1000. In this way not only is the DC offset introduced by the amplifier cancelled, but any DC offset introduced by the DAC is also cancelled.

Figure 12:
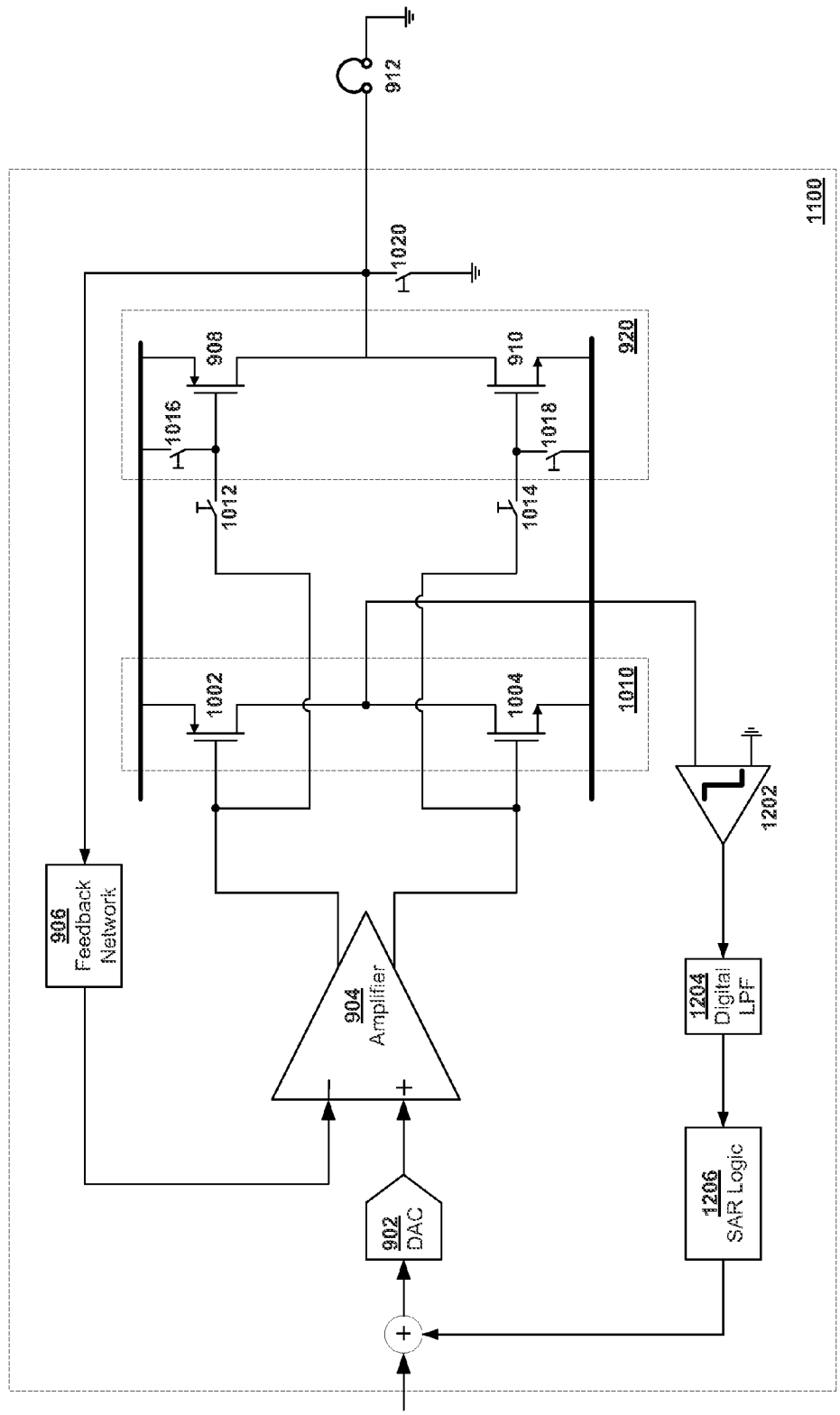
FIG. 12 illustrates another implementation of an audio driver.

FIG. 12 illustrates another implementation of audio driver 1100. In this implementation audio driver 1100 employs the auto-zeroing circuitry described in FIG. 8. The auto-zeroing circuit comprises comparator 1202, digital low-pass filter 1204 and SAR logic 1206. An embodiment of the operation of these circuit elements is described above with reference to FIG. 8.

Figure 13:
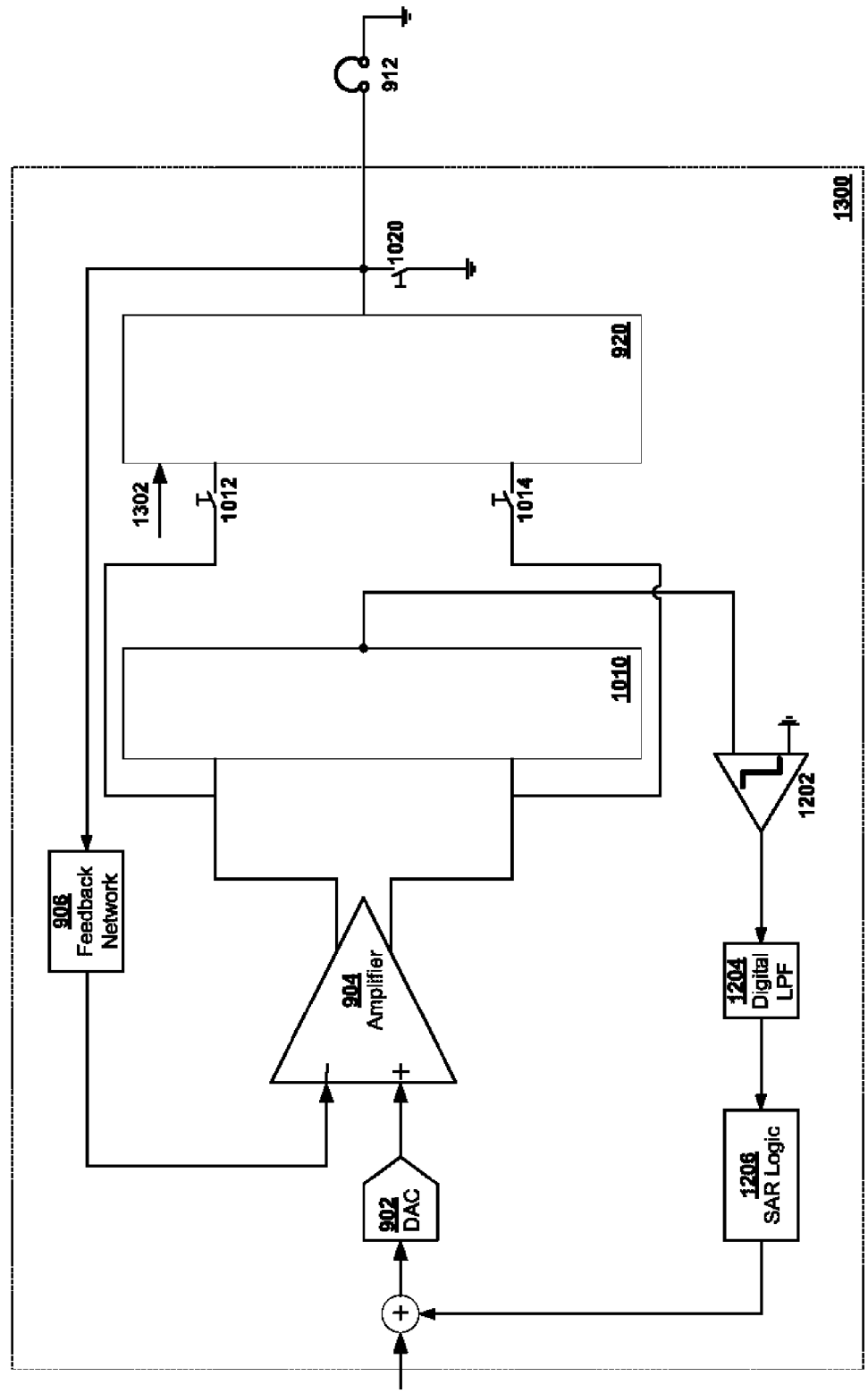
FIG. 13 illustrates another embodiment of an audio driver employing the auto-zeroing approach of FIG. 8.

FIG. 13 illustrates another embodiment of an audio driver employing the auto-zeroing approach of FIG. 8. In this embodiment, output stages 920 and 1010 are audio output stages and are not limited to the output stages shown in the previous figures. For example, the output stages could comprise bipolar transistors rather than FETs or could comprise an alternate topology. For clarity, the ability to switch output stage 920 into a high impedance mode is abstracted into output stage 920 and controlled by input 1302 which controls whether the audio driver is in the sampling phase or the operational phase. If it is in the sampling phase, it puts output stage into high impedance mode and takes it out of high impedance mode when the driver is in the operational phase.

The example shown is for a push-pull output stage, and the amplifier supplies two outputs to the output stage which has a single output. The use of a replica output stage can be applied to many other circumstances such as a single input output stage or a fully differential output stage. A replica of the output stage is added to the audio driver and during the sampling phase, the output stage is disconnected, placed into a high impedance stage and the output is zeroed. Generically, zeroed is meant to imply a zero output value, so in the case of a single ended driver, zeroed means grounded, but in the case of a differential driver, zeroed means that the difference between the two outputs is zero. In either case, zero includes a range of error within which the audible artifacts associated with the DC offset are suitably removed. This range of permissible error is often defined by requirements. For example some requirements defined this "inaudible" threshold has 65 dB below the maximum voltage swing, that is, the voltage of the high power rail minus the voltage of the low power rail. Often this translates to ½ to 1 millivolt.

Figure 14:
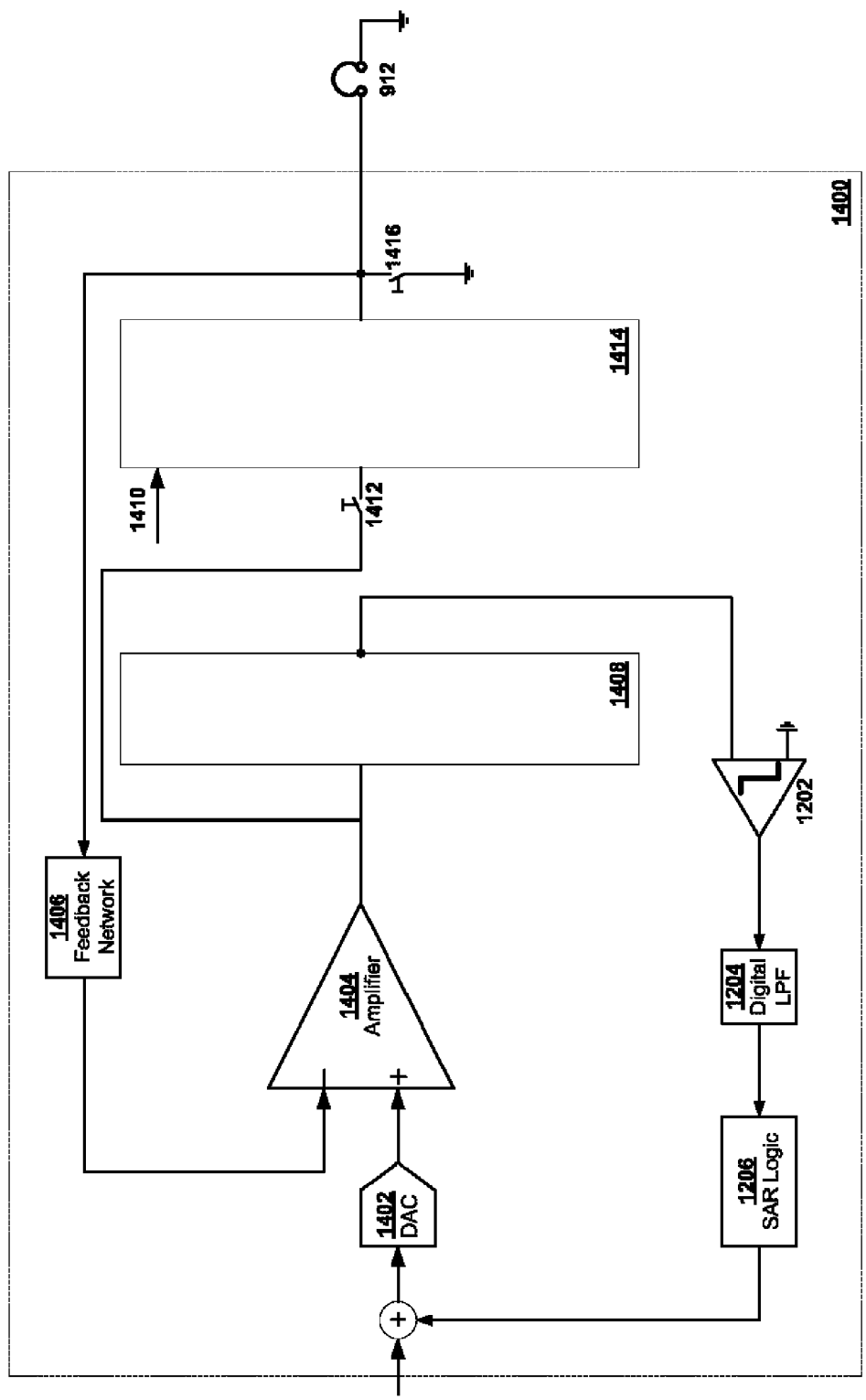
FIG. 14 illustrates an embodiment of an audio driver where the output stage receives only one input from the amplifier.

FIG. 14 illustrates an embodiment of an audio driver where the output stage receives only one input from the amplifier. Audio driver 1400 comprises DAC 1402, amplifier 1404, and feedback network 1406 which function essentially the same as DAC 902, amplifier 904 and feedback network 906 except that amplifier 1404 provides a single output to the output stage. Audio driver 1400 comprises output stage 1414 which can optionally be put into a high impedance mode shown here as controlled by input 1410. Switch 1412 disconnects output stage 1414 during the sampling phase and switch 1416 grounds the output during the sampling phase. Because there is only one input to output stage 1414 only one switch is needed to disconnect it from amplifier 1404. The auto-zeroing circuitry in audio driver 1400 comprises comparator 1202, digital low-pass filter 1204 and SAR logic 1206. Though shown with this specific auto-zeroing circuitry, other auto-zeroing techniques and configurations such as shown in FIGS. 4, 5, 10 and 11 could be used.

Figure 15:
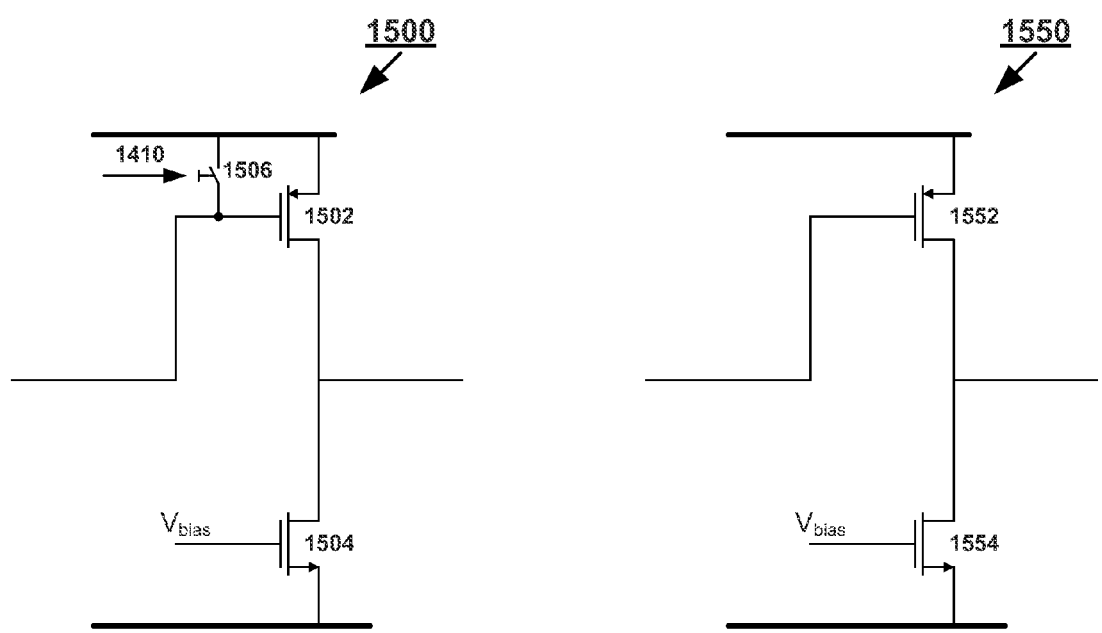
FIG. 15 shows an embodiment of an output stage and replica output stage that can be used in audio driver as output stages, respectively.

FIG. 15 shows an embodiment of an output stage 1500 and replica output stage 1550 that can be used in audio driver 1400 as output stages 1414 and 1408, respectively. Output stage 1500 comprises PFET 1502 and NFET 1504, where the output is tapped between the drain of PFET 1502 and the drain of the NFET 1504. The source of PFET 1502 is coupled to the high supply voltage rail and the source of NFET 1504 is coupled to the low supply rail. Unlike output stage 920, the input to the output stage is coupled to the gate of PFET 1502 and the gate of NFET 1502 is coupled to a bias voltage. Switch 1506 is added to the conventional output stage and used to place output stage 1500 and more specifically PFET 1502 into a high impedance state. Switch 1506 can be controlled by signal 1410. Replica output stage 1550 comprises PFET 1552 and NFET 1554 connected in essentially the same configuration as output stage 1500. However, PFET 1552 and NFET 1554 can be a smaller version of PFET 1502 and NFET 1504. This type of output stage may be used in a class A amplifier.

Figure 16:
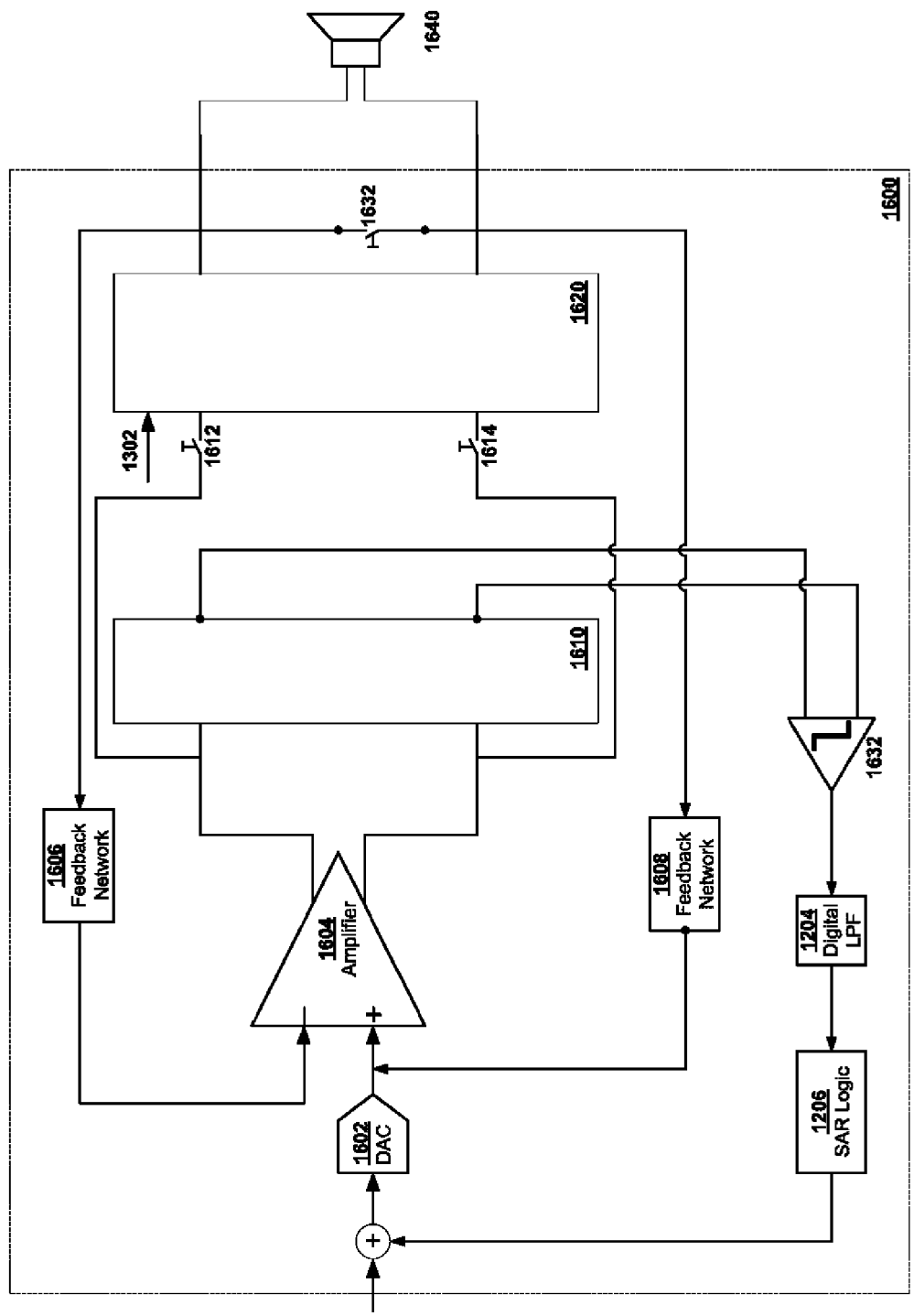
FIG. 16 is an example of an audio driver with a fully differential output stage.

FIG. 16 is an example of an audio driver with a fully differential output stage. Audio driver 1600 comprises DAC 1602, amplifier 1604, feedback network 1606 and feedback network 1608. Amplifier 1604 differs from the previous amplifiers described in that outputs constitute a differential signal. Audio driver 1600 also comprises output stage 1620 which is a fully differential output stage. Because of the differential outputs, two feedback networks 1606 and 1608 are included to provide stability to the driver. To enable the auto-zeroing, replica output stage 1610 is added which functions similar to output stage 1620 and may be a smaller version with smaller transistors. Each differential output of the replica output stage is supplied to comparator 1632 which differs from comparator 1202 in previous figures because it compares the positive and negative differential outputs rather than comparing a single output to ground. When no signal is supplied, the positive and negative differential outputs should be the same. Digital low-pass filter 1204 and SAR logic 1206 may function as described in earlier embodiments. Audio driver 1600 further comprises switches 1612 and 1614 which are open during the sampling phase and closed during the operational phase and serve to disconnect and connect output stage 1620 to amplifier 1604. Switch 1632 is used to tie the positive and negative differential outputs during the sampling phase thus "zeroing" the output during the sampling phase. Differential output stage 1620 drives differential load 1640 (shown as a speaker here) during the operational phase.

The DC offset cancellation described can be applied to any multi-stage audio driver or multi-stage amplifier applications, having a separate output stage. The offset is performed offline before the output stage is enabled eliminating any transitions during startup. By feeding back the auto-zeroing value into the digital domain, no additional analog components are required for the correction eliminating a potential source of distortion. Furthermore, any DC offset contributed by any component in the analog portion of the driver including the DAC can be removed. All added components are comparatively small to the ordinary components in an audio driver, and thus have negligible impact on the die size of the audio driver system.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. An audio driver comprising:
   an input stage operable to receive and amplify an analog sound signal;
   an output stage having an audio output for driving a load;
   a replica output stage coupled to the amplifier to receive the amplified analog signal and having a replica audio output;
   a first switch operable to selectively connect the output stage and the amplifier during an operation phase and disconnect the output stage and the amplifier during a sampling phase; and
   an auto-zeroing circuit coupled to the replica output stage to receive the replica audio output and adjust the input stage to zero out any DC offset detected in the replica audio output utilizing a comparator to compare the replica audio output to a reference voltage.

2. The audio driver of claim 1 wherein the output stage is operable to receive a control signal to put the output stage into a high impedance mode.

3. The audio driver of claim 1 wherein the output stage comprises a first n-type field effect transistor (NFET) and a first p-type field effect transistor (PFET).

4. The audio driver of claim 3 further comprising:
   a second switch connecting the gate of the first NFET to a high supply voltage rail; and
   a third switch connecting the gate of the first PFET to a low supply voltage rail;
   wherein the second switch and the third switch are closed during the sampling phase and opened during the operation phase.

5. The audio driver of claim 3 wherein the replica output stage comprises a second NFET and a second PFET, wherein the second NFET is smaller than the first NFET and the second PFET is smaller than the first PFET.

6. The audio driver of claim 1 further comprising:
   a second switch connecting the output of the output stage to a low supply voltage rail, wherein the second switch is closed during the sampling phase and opened during the operation phase.

7. The audio driver of claim 1 wherein the auto-zeroing circuit comprises:

the comparator comparing the output of the replica output stage to a low supply voltage; and
a successive approximation register (SAR) logic.

8. The audio driver of claim 1 wherein the auto-zeroing circuit further comprises a low-pass filter.

9. The audio driver of claim 1 wherein the amplifier is a class AB amplifier having a first output and a second output coupled to the output stage and replica output stage; wherein the first output is coupled to the output stage with the first switch and the second output is coupled to the output stage with the second switch.

10. The audio driver of claim 1 wherein the amplifier is a differential amplifier having a first output and a second output coupled to the output stage and replica output stage; wherein the first output is coupled to the output stage with the first switch and the second output is coupled to the output stage with the second switch.

11. The audio driver of claim 10 further comprising a third switch coupling the output of the output stage to a second output of the output stage, wherein the third switch is closed during the sampling phase and open during the operation phase.

12. The audio driver of claim 10 wherein the auto-zeroing circuit comprises:
the comparator comparing the output of the replica output stage to a second output of the replica output stage; and
a successive approximation register (SAR) logic.

13. The audio driver of claim 12 wherein the auto-zeroing circuit further comprises a low-pass filter.

14. A method of cancellation of a DC offset in an audio driver comprising:
disconnecting an output stage of the audio driver from an amplifier and connecting an output of said output stage to a low supply voltage rail;
auto-zeroing an output of a replica output stage;
connecting the output stage to the amplifier and disconnecting said output of said output stage from said low voltage rail.

15. The method of claim 14 further comprising:
configuring the output stage into a high impedance state during the auto-zeroing.

16. The method of claim 14 wherein the auto-zeroing comprises:
comparing the output of the replica stage to a voltage provided by a low supply voltage rail;
adjusting a SAR logic on the basis of comparing the output to the voltage;
repeating the comparing and the adjusting until the DC offset is cancelled; and
freezing the SAR logic.

17. The method of claim 16 further comprising low-pass filtering input signals to the SAR logic.

18. An audio driver comprising:
a digital to analog converter (DAC) having an input operable to receive an digital sound signal and produce a analog sound signal;
an amplifier operable to amplify the analog sound signal;
an output stage having an output;
a replica output stage having an output coupled to the amplifier;
a means for disconnecting and connecting the amplifier to the output stage; and
a means for auto-zeroing the output of the replica output stage by comparing the output of the replica output stage to a voltage provided by a low supply voltage rail.

19. The audio driver of claim 18, wherein the means for auto-zeroing further comprises:

a means for adjusting a successive approximation register (SAR) logic; and
a means for freezing a SAR logic.

20. An audio driver comprising:
an input stage operable to receive and amplify an analog sound signal;
an output stage having:
an audio output for driving a load;
a first n-type field effect transistor (NFET), a second switch connecting the gate of the first NFET to a high supply voltage rail; and
a first p-type field effect transistor (PFET), a third switch connecting the gate of the first PFET to a low supply voltage rail;
a replica output stage coupled to the amplifier to receive the amplified analog signal and having a replica audio output;
a first switch operable to selectively connect the output stage and the amplifier during an operation phase and disconnect the output stage and the amplifier during a sampling phase; and
an auto-zeroing circuit coupled to the replica output stage to receive the replica audio output and adjust the input stage to zero out any DC offset detected in the replica audio output;
wherein the second switch and the third switch are closed during the sampling phase and opened during the operation phase.

21. An audio driver comprising:
an input stage operable to receive and amplify an analog sound signal;
an output stage having:
an audio output for driving a load;
a first n-type field effect transistor (NFET); and
a first p-type field effect transistor (PFET);
a replica output stage coupled to the amplifier to receive the amplified analog signal and having a replica audio output, wherein the replica output stage comprises a second NFET and a second PFET, wherein the second NFET is smaller than the first NFET and the second PFET is smaller than the first PFET;
a first switch operable to selectively connect the output stage and the amplifier during an operation phase and disconnect the output stage and the amplifier during a sampling phase; and
an auto-zeroing circuit coupled to the replica output stage to receive the replica audio output and adjust the input stage to zero out any DC offset detected in the replica audio output.

22. An audio driver comprising:
an input stage operable to receive and amplify an analog sound signal;
an output stage having an audio output for driving a load;
a replica output stage coupled to the amplifier to receive the amplified analog signal and having a replica audio output;
a first switch operable to selectively connect the output stage and the amplifier during an operation phase and disconnect the output stage and the amplifier during a sampling phase;
an auto-zeroing circuit coupled to the replica output stage to receive the replica audio output and adjust the input stage to zero out any DC offset detected in the replica audio output; and a second switch connecting the output of the output stage to a low supply voltage rail, wherein the second switch is closed during the sampling phase and opened during the operation phase.

23. An audio driver comprising:
an input stage operable to receive and amplify an analog sound signal;
an output stage having an audio output for driving a load;
a replica output stage coupled to the amplifier to receive the amplified analog signal and having a replica audio output;
a first switch operable to selectively connect the output stage and the amplifier during an operation phase and disconnect the output stage and the amplifier during a sampling phase; and
an auto-zeroing circuit coupled to the replica output stage to receive the replica audio output and adjust the input stage to zero out any DC offset detected in the replica audio output, the auto-zeroing circuit including:
 a comparator comparing the output of the replica output stage to a low supply voltage; and
 a successive approximation register (SAR) logic.

24. An audio driver comprising:
an input stage operable to receive and amplify an analog sound signal;
an output stage having an audio output for driving a load;
a replica output stage coupled to the amplifier to receive the amplified analog signal and having a replica audio output;
a first switch operable to selectively connect the output stage and the amplifier during an operation phase and disconnect the output stage and the amplifier during a sampling phase; and
an auto-zeroing circuit coupled to the replica output stage to receive the replica audio output and adjust the input stage to zero out any DC offset detected in the replica audio output, the auto-zeroing circuit including a low-pass filter.

25. A method of cancellation of a DC offset in an audio driver comprising:
disconnecting an output stage of the audio driver from an amplifier;
auto-zeroing an output of a replica output stage, the auto-zeroing including:
 comparing the output of the replica stage to a voltage provided by a low supply voltage rail;
 adjusting a SAR logic on the basis of comparing the output to the voltage;
 repeating the comparing and the adjusting until the DC offset is cancelled;
 freezing the SAR logic;
connecting the output stage to the amplifier.

* * * * *

UNITED STATES PATENT AND TRADEMARK OFFICE
CERTIFICATE OF CORRECTION

PATENT NO. : 8,344,797 B2  
APPLICATION NO. : 12/623202  
DATED : January 1, 2013  
INVENTOR(S) : Crespi et al.

Page 1 of 1

It is certified that error appears in the above-identified patent and that said Letters Patent is hereby corrected as shown below:

In the Claims:

Col. 8, line 31, "the amplifier" should read --an amplifier--.

Col. 10, line 16, "the amplifier" should read --an amplifier--.

Col. 10, line 38, "the amplifier" should read --an amplifier--.

Col. 10, line 57, "the amplifier" should read --an amplifier--.

Col. 11, line 9, "the amplifier" should read --an amplifier--.

Col. 12, line 1, "the amplifier" should read --an amplifier--.

Signed and Sealed this  
Twenty-fifth Day of March, 2014

Michelle K. Lee  
*Deputy Director of the United States Patent and Trademark Office*